United States Patent
Lin et al.

(10) Patent No.: US 6,421,224 B1
(45) Date of Patent: Jul. 16, 2002

(54) MICRO-STRUCTURE CAPACITOR

(75) Inventors: Hung-Yi Lin; Hung-Yin Tsai; Jung-Yen Huang, all of Hsinchu; Chin-Hon Fan, Miaoli Hsien, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/983,259

(22) Filed: Oct. 23, 2001

(51) Int. Cl.[7] ............................................... H01G 4/228
(52) U.S. Cl. ..................... 361/306.3; 361/306.1; 361/321.1; 361/293; 361/308.3; 438/331; 438/386; 438/253; 257/347; 257/532
(58) Field of Search ............................ 361/306.1, 306.3, 361/293, 234, 309, 308.3, 311, 313, 321.1, 321.5, 330; 257/331, 347, 532, 520; 438/331, 386, 253

(56) References Cited

U.S. PATENT DOCUMENTS

| | | | |
|---|---|---|---|
| 4,723,194 A | * | 2/1988 | Nakamura et al. ........... 361/330 |
| 5,811,868 A | * | 9/1998 | Bertin et al. ................. 257/516 |
| 5,923,511 A | * | 7/1999 | Bandara et al. ............. 360/135 |
| 6,177,716 B1 | * | 1/2001 | Clark .......................... 257/532 |
| 6,239,461 B1 | * | 5/2001 | Lee ............................. 257/306 |
| 6,262,450 B1 | * | 7/2001 | Kotecki et al. ............. 257/306 |
| 6,331,931 B1 | * | 12/2001 | Titizian et al. ........... 361/306.3 |

* cited by examiner

Primary Examiner—Dean A. Reichard
Assistant Examiner—Nguyen T. Ha
(74) Attorney, Agent, or Firm—Birch, Stewart, Kolasch & Birch, LLP

(57) ABSTRACT

The invention discloses a micro-structure capacitor formed by joining the metal layer of a multi-porous micro-structure. A substrate is used as an etching stop layer when producing the capacitor. Therefore, pores with low aspect ratio and uniform size are formed on the surface of the substrate. The efficiency of the subsequent thin film coating process is increased. The porous three-dimensional structure increases the capacitance. Micro-structures are stacked up so the capacitor produced features small size and high capacitance.

10 Claims, 5 Drawing Sheets

MICRO-STRUCTURE CAPACITOR

BACKGROUND OF THE INVENTION

1. Field of the Invention

The invention relates to a micro-structure capacitor that is applied in high surface area/volume ratio capacitors and micro reactors.

2. Related Art

A capacitor is one of three passive devices and its main function is to store electric charge. There are aluminum electrolytic capacitors, tantalum electrolytic capacitors, ceramic capacitors, electrolytic capacitors, and others. Capacitors can be simply divided into fixed capacitors, variable capacitors, and chip capacitors. Ceramic capacitors can be divided into single layer ceramic capacitors (disk ceramic capacitors) and multi layer ceramic capacitors (MLCC).

MLCCs have compact size, which is required for modem electronic devices, and they also provide the following advantages: high capacity, low inner inductance that makes them suitable for high frequency, high insulation, low current leakage, high stability because the inner electrode is protected by ceramic and not easily effected by the environment, high thermal resistance, non polarity, and surface mount. Because of the features mentioned above, MLCCs are widely applied in cellular phones and laptop computers, which need smaller sized capacitors.

The size of the MLCC has to be smaller and smaller because electronic devices are becoming more and more compact. In order to maintain large capacitance, more layers inside the MLCC are necessary. Miniaturization of material particles and controlling of layers have to be considered in the manufacturing process. Because the manufacturing temperature is as high as 300–400 degree C, one must take thermal resistance into consideration when selecting materials. These points mentioned above indicate that the manufacturing processes, selection of material, and packaging are becoming more and more difficult. Another type of porous micro-structure capacitor uses a three-dimensional structure such as multiple grooves to increase the surface area of electrodes A thin film process is then used to reduce the thickness in order to obtain a micro structure capacitor with high capacitance. However, it is very difficult to have a layer of thin film coated on the pore with high aspect ratio (depth/width ratio). That is to say, a regular etching process is not able to obtain deep etching so the quality of the product is not uniform. When the aspect ratio of a micro structure pore increases, the coating process usually ends up creating thicker coating in the opening of the pore and thinner coating in the bottom of the pore, or the opening is blocked so the bottom portion is not coated at all.

These conventional micro-structure capacitors that put emphasis on high porosity and high aspect ratio for obtaining high electrode surface area are always three-dimensional, so the capacitance increases as the electrode surface area increases. However, pore size is not very uniform because it is not well controlled, so the capacitance can't be easily controlled. Because very deep pores are required to obtain high capacitance, the coating process usually produces a thicker layer in the opening and thinner layer in the bottom of the pores. The thin-film layer generated by a regular sputtering instrument is unable to achieve good coverage over the pores with high aspect ratio.

SUMMARY OF THE INVENTION

Because of the problems of conventional techniques and the requirements of micro-structure capacitors, the invention provides a micro-structure capacitor having micro-structure and high capacitance.

According to the technique disclosed in the invention, the micro-structure capacitor of the invention stacks up micro-structure devices with uniform pores to increase capacitance. Each micro-structure device contains low aspect ratio and uniform porosity. The best aspect ratio is about 5:1, though a range between 5:1 to 10:1 is also acceptable. The manufacturing process is thus easier and those devices requiring a high surface area to volume ratio are easier to produce.

The micro-structure capacitor of the invention uses SOI (silicon on insulator) as an etching stop layer. A wet etching process is performed and then stopped at the etching stop layer. Therefore, uniform etching depth can be obtained. After pores are produced by the etching process, a layer of high dielectric constant thin film is formed on the SOI substrate, and then a metal layer is formed on the thin film. Metal layers with uniform porosity obtained by the above process are then bonded together to form a micro-structure capacitor. Different metal joining methods can be used to form micro-structure capacitors with different structures. For example, micro structure devices can be stacked up to form a multi layer micro-structure capacitor, or micro structure devices can be joined parallel to one another to form a multi parallel layer micro-structure capacitor. Each of the micro-structure capacitors features very small size and high capacitance.

SOI (silicon on insulator) is used as the etching stop layer in the invention. Wet etching is used for producing multiple pores with uniform depth. The invention provides integration of devices so electrodes with high surface area and pores with better coating ability can be obtained even if the aspect ratio is reduced.

Further scope of applicability of the invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The invention will become more fully understood from the detailed description given herein below. However, the following description is for purposes of illustration only, and thus is not limitative of the invention, wherein.

DETAILED DESCRIPTION OF THE INVENTION

Figure 1:
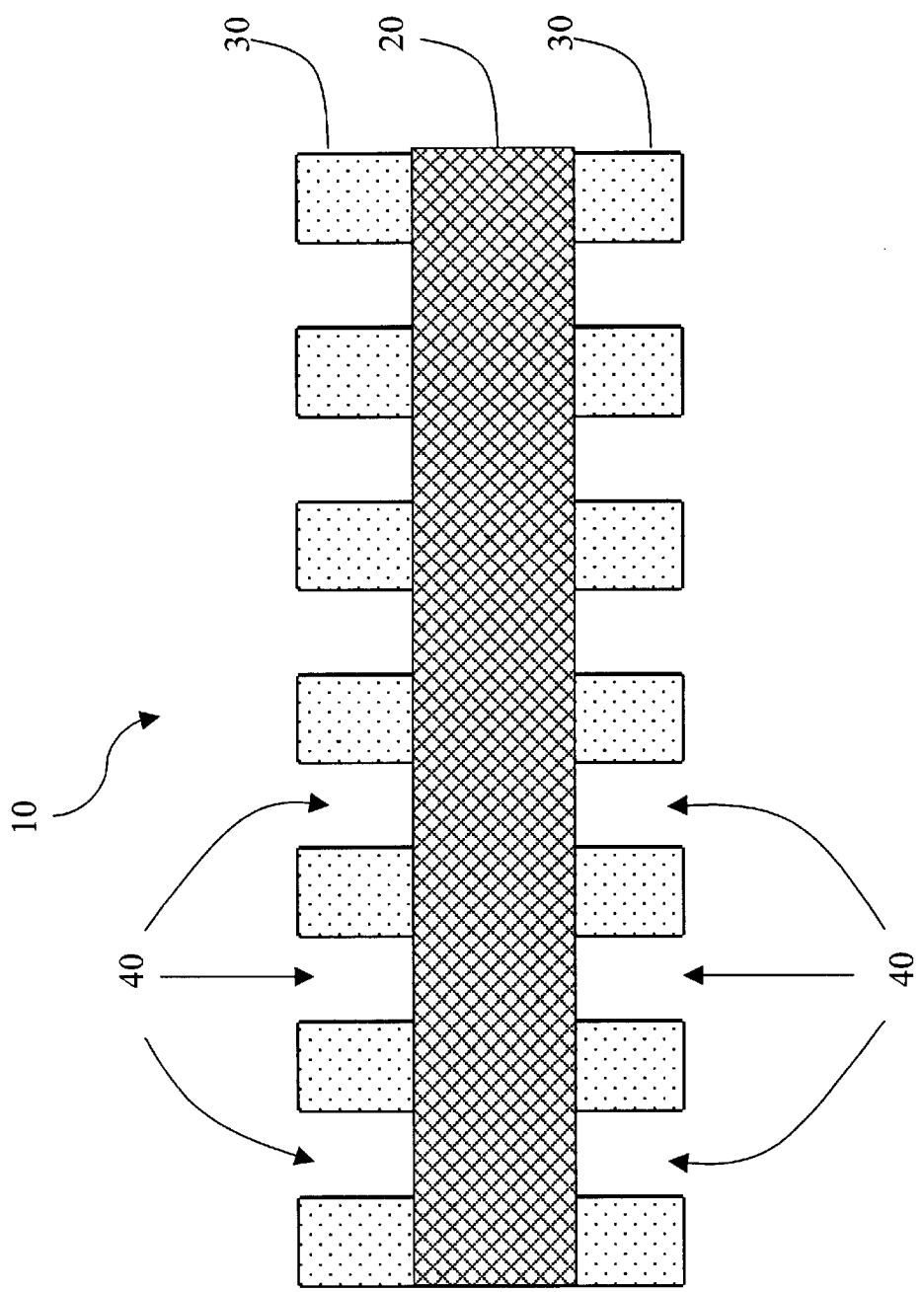
FIG. 1 illustrates a magnified cross-sectional view of the uniform porosity of the micro-structure device in the invention.

Please refer to FIG. 1, which illustrates a magnified cross-sectional view of the micro-structure device having uniform porosity 10 in the invention. The micro-structure device having uniform porosity 10 is formed by etching. A SOI (silicon on insulator) is used as an etching stop layer and then wet etching is performed to form the micro-structure device having uniform porosity 10. FIG. 1 shows that the silicon layer 30 above and below the SOI substrate 20 is etched to form three dimensional pores 40 with uniform size. Each pore has a low aspect ratio. The best aspect ratio is between 5:1 and 10:1.

The material of the SOI substrate 20 can be silicon oxide, silicon nitride or highly P-type element doped material. The etchant used in the wet etching step can be KOH (potassium hydroxide) for anisotropic etching or HF (hydro fluoro acid) for electrochemical etching.

Figure 2:
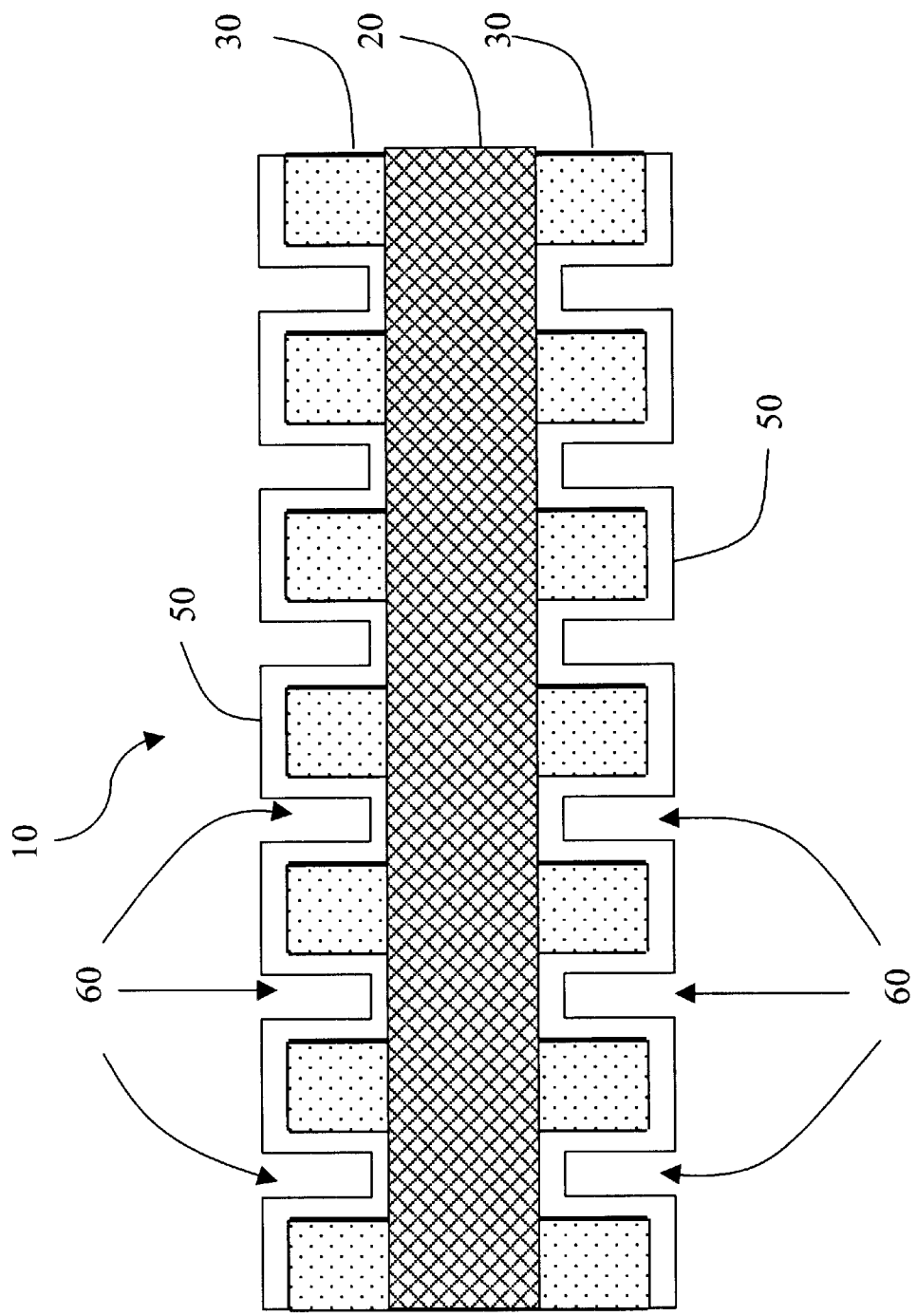
FIG. 2 illustrates a magnified cross-sectional view of the uniform porosity of the micro-structure device in the invention.

Please refer to FIG. 2, which illustrates a magnified cross-sectional view of the micro-structure device having uniform porosity 10 in the invention. A dielectric thin film 50 is coated on the micro-structure device having uniform porosity 10.

After the micro-structure with uniform porosity is produced by the etching step, the dielectric thin film 50 can be formed on the microstructure by PVD (Physical Vapor Deposition) or CVD (Chemical Vapor deposition). The material for the dielectric thin film 50 can be a high K (high dielectric constant) material in order to obtain high capacitance. As shown in FIG. 2, a smaller pore 60 is maintained in the pores 40 after the dielectric thin film 50 is formed.

Figure 3:
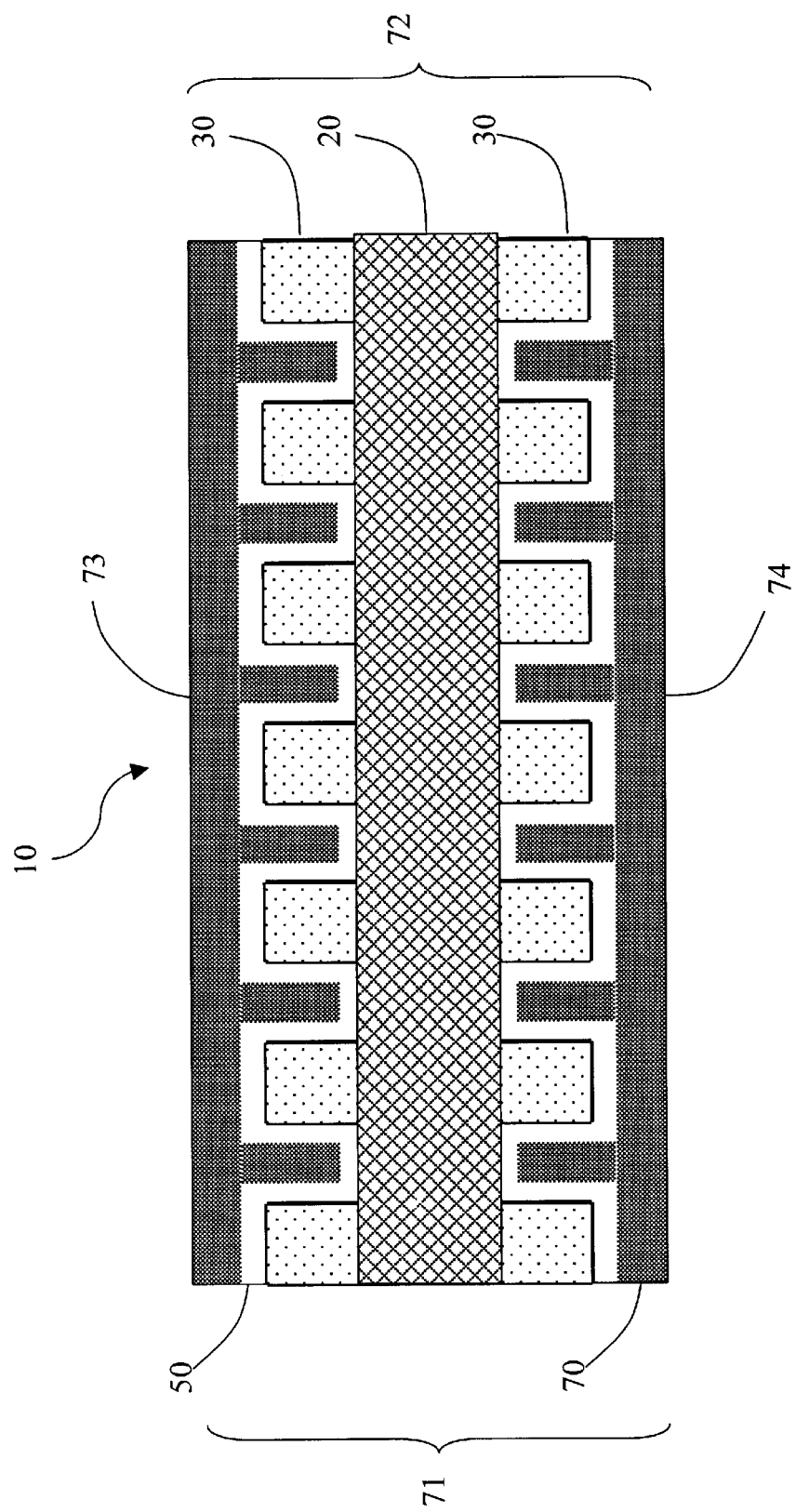
FIG. 3 illustrates a magnified cross-sectional view of the uniform porosity of the micro-structure device in the invention.

Please refer to FIG. 3, which illustrates a magnified cross-sectional view of the uniform porosity of the micro-structure device in the invention. A metal layer 70 used as an electrode is formed on the dielectric thin film 50.

After the dielectric thin film 50 is formed on the micro-structure device with uniform porosity, the metal layer 70 is formed and filled in the pores 60 to form a three-dimensional capacitor. This special design increases the surface area of the electrode in the capacitor.

As shown in FIG. 3, the micro-structure device having uniform porosity 10 is formed by the technique disclosed in the invention. An SOI substrate 20 is located in the middle of the micro-structure device having uniform porosity 10. Three-dimensional pores are located above and below the SOI substrate 20. Each pore has a low aspect ratio. The best aspect ratio is about 5:1, though it can be between 5:1 and 10:1. A dielectric thin film 50 is formed on the upper and lower surface of the SOI substrate. A metal layer 70 is formed on the dielectric thin film 50. The outer surface of the metal layer 70 can be planar. Therefore, the capacitor formed by the micro-structure device having uniform porosity 10 in the invention features small size and large capacitance.

After the micro-structure device having uniform porosity 10 porosity is formed, the micro-structure device having uniform porosity 10 can be joined together by various methods. After joining the micro-structure devices disclosed in the invention, various types of micro-structure capacitor can be obtained. These methods include joining the left surface 71 of one micro-structure device having uniform porosity 10 to the right surface 72 of another micro-structure device having uniform porosity 10, and joining the upper surface 73 of one micro-structure device having uniform porosity 10 to the lower surface 74 of another micro-structure device having uniform porosity 10. In other words, join the metal layer on the left side of one micro-structure device to the metal layer on the right side of another micro-structure device, or join the metal layer on the left side of one micro-structure device having uniform porosity 10 to the metal layer on the right side of another micro-structure device having uniform porosity 10. Therefore, a micro-structure capacitor with large capacitance can be obtained.

Figure 4:
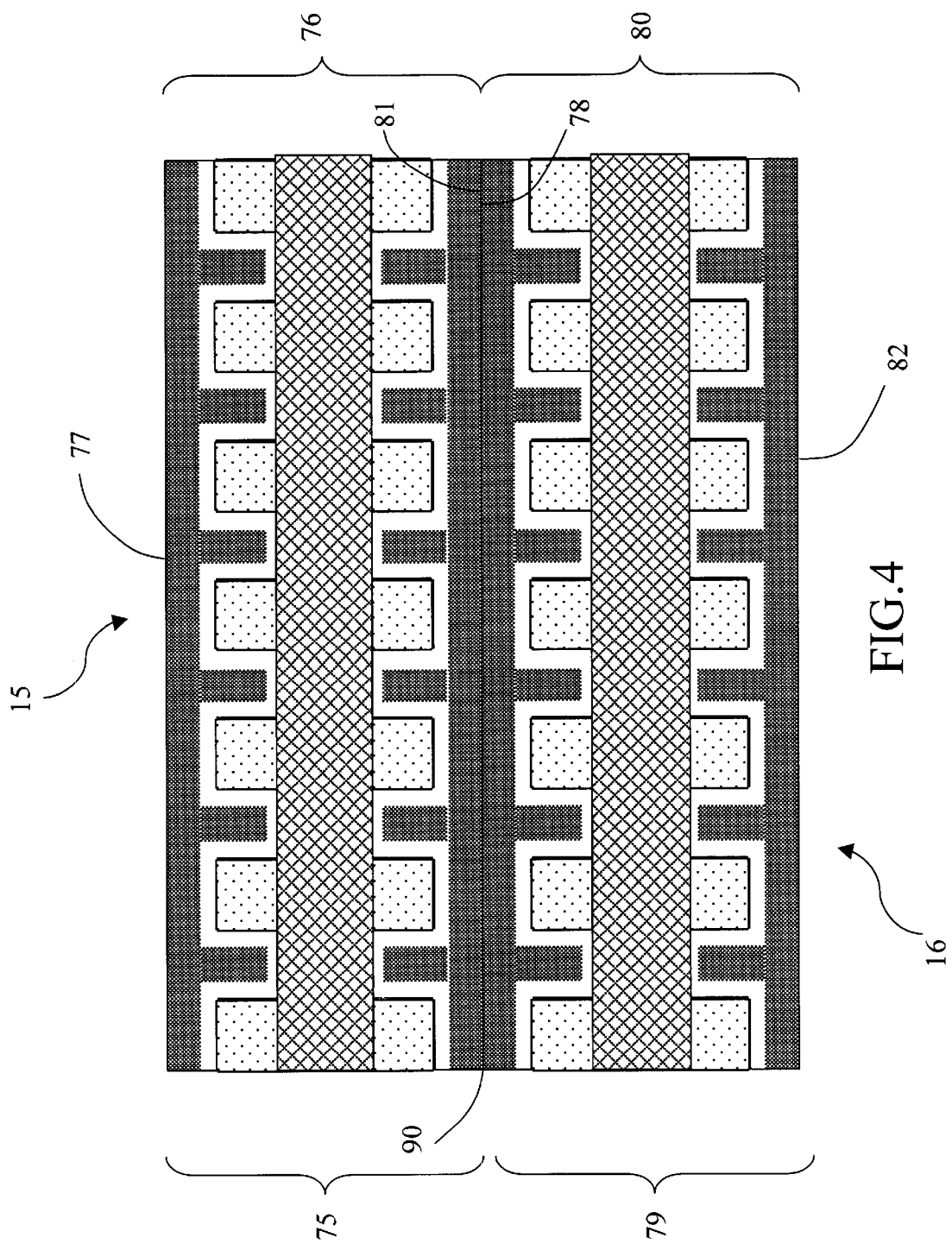
FIG. 4 illustrates a magnified cross-sectional view of the micro-structure capacitor in the first embodiment of the invention.

Please refer to FIG. 4, which illustrates a magnified cross-sectional view of the micro-structure capacitor in the first embodiment of the invention. A first micro-structure device having uniform porosity 15 and a second micro structure device having uniform porosity 16 are stacked up and joined together at the joint 90 to form a multi layer micro-structure capacitor.

In order to obtain the micro-structure capacitor as shown in FIG. 4, the metal layer on the lower surface 78 of the first micro-structure device having uniform porosity 15 and the metal layer on the upper surface 81 of the second micro-structure device having uniform porosity 16 are stacked up and joined together at the joint 90 by physical or chemical processes. The joining method can be, for example, a thermal process. Similarly, metal layers of multiple micro-structure devices having uniform porosity 10 can be stacked up and joined together by a physical or chemical process to form a multi layer micro-structure capacitor.

Figure 5:
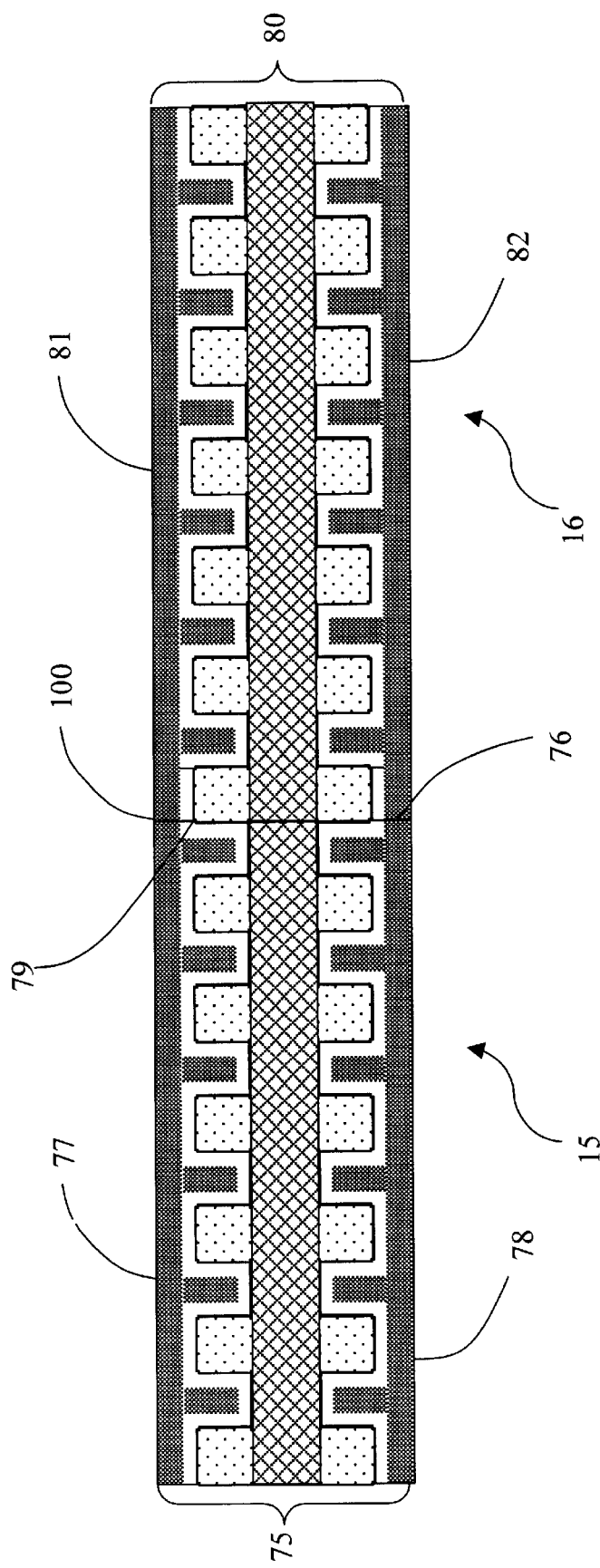
FIG. 5 illustrates a magnified cross-sectional view of the micro-structure capacitor in the second embodiment of the invention.

Another joining method is shown in FIG. 5, which illustrates a magnified cross-sectional view of the micro-structure capacitor in the second embodiment of the invention. The first micro-structure device having uniform porosity 15 and the second micro-structure device having uniform porosity 16 are located side by side and joined together at the joint 100 to form a long chain-shaped multi layer micro-structure capacitor.

In order to obtain the micro-structure capacitor as shown in FIG. 5, the metal layer on the right surface 76 of the first micro-structure device having uniform porosity 15 and the metal layer on the left surface 79 of the second micro-structure device having uniform porosity 16 are joined side by side at the joint 100. Similarly, the metal layers of multiple the micro-structure devices having uniform porosity 10 can be joined side by side by a physical or chemical process to form a long chain-shaped multi layer micro-structure capacitor.

The micro-structure capacitor of the invention has a long chain-shaped multi layer micro structure. Micro-structure devices with a low aspect ratio are joined together by a physical or chemical process. Because of the low aspect ratio of the pores in the micro-structure device, the difficulty of coating thin film on the pores is reduced.

To obtain the micro-structure capacitor of the invention, SOI (silicon on insulator) substrate is used as the etching stop layer, and wet etching is used to form pores with uniform depth. The invention provides integration of devices so electrodes with high surface area and pores with better coating ability can be obtained.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. Micro-structure capacitor formed by joining a plurality of micro-structure devices having uniform porosity, each micro-structure device having uniform porosity further comprises, a SOI (silicon on insulator) substrate, a plurality of uniform sized three dimensional pores are located above and below said SOI substrate, a dielectric thin film is formed on the upper and lower surface of said SOI substrate, and a metal layer is formed on the dielectric thin film to form the upper surface and lower surface of said micro-structure device having uniform porosity.

2. Micro-structure capacitor of claim 1, wherein the material of the insolator of said SOI substrate can be selected from the group consisting of silicon oxide, silicon nitride and highly P-type element doped material.

3. Micro-structure capacitor of claim 1, wherein the material of said SOI substrate is used as an etching stop layer.

4. Micro-structure capacitor of claim 1, wherein said three dimensional pores are formed by a wet etching step.

5. Micro-structure capacitor of claim 4, wherein said etchant used in the wet etching step can be KOH (potassium hydroxide) for anisotropic etching or HF (hydro fluoro acid) for electrochemical etching.

6. Micro-structure capacitor of claim 1, wherein the best aspect ratio of said three dimensional pores is 5:1.

7. Micro-structure capacitor of claim 1, wherein the aspect ratio of said three dimensional pores can be between 5:1 to 10:1.

8. Micro-structure capacitor of claim 1, wherein the material of said dielectric thin film is high dielectric constant material.

9. Micro-structure capacitor of claim 1, wherein the metal layers of multiple said micro-structures with uniform porosity can be stacked up and joined together by a thermal process to form a multi layer micro-structure capacitor.

10. Micro-structure capacitor of claim 1, wherein the metal layers of said the microstructures with uniform porosity can be joined side by side by a thermal process to form a long-chain shaped multi layer micro structure capacitor.

* * * * *